US006939484B2

(12) United States Patent
Dorfman

(10) Patent No.: US 6,939,484 B2
(45) Date of Patent: Sep. 6, 2005

(54) THICK FILM CONDUCTOR COMPOSITIONS FOR USE IN MEMBRANE SWITCH APPLICATIONS

(75) Inventor: Jay Robert Dorfman, Durham, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 51 days.

(21) Appl. No.: 10/728,142

(22) Filed: Dec. 4, 2003

(65) Prior Publication Data

US 2005/0121657 A1 Jun. 9, 2005

(51) Int. Cl.[7] .......................... H01B 1/22; B05D 5/12; H01H 1/02

(52) U.S. Cl. ........................ 252/514; 427/58; 200/512

(58) Field of Search ......................... 252/514; 427/58, 427/66, 96; 200/512, 530, 265

(56) References Cited

U.S. PATENT DOCUMENTS

| | | | |
|---|---|---|---|
| 4,371,459 A | 2/1983 | Nazarenko | |
| 4,595,605 A | 6/1986 | Martin et al. | |
| 5,089,173 A | 2/1992 | Frentzel et al. | |
| 5,653,918 A | 8/1997 | Towlson | |
| 6,445,128 B1 * | 9/2002 | Bush et al. | 313/509 |
| 6,787,993 B2 * | 9/2004 | Bush et al. | 313/509 |

* cited by examiner

*Primary Examiner*—Mark Kopec

(57) ABSTRACT

The present invention relates to a thick film conductor composition comprising: (a) electrically conductive silver powder; (b) PVDF/HFP polymer resin, copolymers of a PVDF/HFP polymer resin, and mixtures thereof; dissolved in (c) organic solvent, with the provisos that the PVDF/HFP resin has a melt viscosity of 0.2–0.7 kPoise and a DSC melt temperature in the range of 85–98° C.

7 Claims, No Drawings

THICK FILM CONDUCTOR COMPOSITIONS FOR USE IN MEMBRANE SWITCH APPLICATIONS

FIELD OF THE INVENTION

The invention is directed to improved thick film conductor compositions and in particular to such compositions which are resistant to silver migration in membrane touch switch applications.

BACKGROUND OF THE INVENTION

Polymeric thick film inks consist of particles containing conductive materials dispersed in an organic vehicle or medium containing volatile solvent and a polymeric resin. After screen-printing, the composition is dried typically by heating at temperatures of up to 150° C. where the organic solvent is dried-off.

The conductive material is responsible for imparting to the thick film material the desired level of resistivity. This is normally limited to less than 0.02 Ohm/sq/mil. The conductive particles typically consist of silver metal for high conductivity and good resistance to oxidation and can be found in flake or non-flake morphologies.

After drying, the polymeric resin's primary function is to bind together the conductive particles to form an electrically conductive circuit pattern. Additionally, the binder system is required to impart the necessary adhesion to the desired substrate. In the case of flexible substrates which may or may not be surface treated, thermoplastic binder systems are typically employed. In general, these consist of polyesters, acrylics, vinyl or polyurethane polymers and may be combined to obtain optimum properties.

Furthermore, the resinous component is also responsible for providing the conductor composition with the required surface hardness, resistance to environmental changes and flexibility.

Historically, linear polyester, acrylic or vinyl copolymer-based resins have been typically been used as the polymeric binder for general purpose membrane touch switch (MTS) conductor pastes. Other types of resins, such as polyurethane resins have also been utilized in membrane touch switch applications.

U.S. Pat. No. 4,595,605 discloses conductive compositions that are solderable and flexible and that can be bonded directly to substrates. These compositions are made from a combination of silver exclusively in the form of flake and vinyl chloride/vinyl acetate copolymer.

U.S. Pat. No. 4,371,459 teaches a screen printable conductor composition useful in membrane touch switch compositions that is flexible comprising (a) a conductive phase containing silver and base metal powders dispersed in a solution of (b) a multipolymer prepared by copolymerization of vinyl acetate, vinyl chloride, and an ethylenically unsaturated dicarboxylic acid and a linear aromatic polyester resin dissolved in (c) volatile nonhydrocarbon solvent.

U.S. Pat. No. 5,653,918 to Towlson discloses a highly flexible and mechanically robust screen-printable conductor composition containing (a) a conductive phase comprising Ag, Au, Cu, Ni, Pd, Pt, C or graphite and mixtures thereof dispersed in a polymer solution containing (b) a terpolymer of polyvinyl acetate, vinyl chloride and a polar component dissolved in a volatile solvent.

Although the above-listed patents cite improvements in adhesion of the composition to the desired substrate and durability, none of the listed patents appear to improve overall lifetime of the touch switch and control of silver migration. The present invention provides a superior thick film conductive composition which increases MTS lifetime by decreasing metal conductor migration.

SUMMARY OF THE INVENTION

The present invention relates to a thick film conductor composition comprising: (a) electrically conductive silver powder; (b) PVDF/HFP polymer resin, copolymers of a PVDF/HFP polymer resin, and mixtures thereof; dissolved in (c) organic solvent, with the provisos that the PVDF/HFP resin has a melt viscosity of 0.2–0.7 kPoise and a DSC melt temperature in the range of 85–98° C.

The invention further relates to a method of forming a membrane touch switch comprising: (a) preparing the composition as described above; (b) applying the composition of (a) onto a substrate; (c) drying the composition of (b) to form a circuit; and (d) applying a voltage across the circuit of (c).

Additionally, the present invention relates to a membrane touch switch utilizing the composition described herein and above and a membrane touch switch formed by the method described herein.

DETAILED DESCRIPTION OF INVENTION

Generally, a thick film composition comprises a functional phase that imparts appropriate electrically functional properties to the composition. The functional phase comprises electrically functional powders dispersed in an organic medium that acts as a carrier for the functional phase. Generally, the composition is fired to burn out the organics and to impart the electrically functional properties. However, in the case of polymer thick film, the organics remain as an integral part of the composition after drying. Prior to firing, a processing requirement may include an optional heat treatment such as drying, curing, reflow, and others known to those skilled in the art of thick film technology. "Organics" comprise polymer or resin components of a thick film composition.

The main components of the thick film conductor composition are a conductor powder dispersed in an organic medium, which is comprised of polymer resin and solvent. The components are discussed herein below.

A. Conductor Powder

The electrically functional powders in the present thick film composition are Ag conductor powders and may comprise Ag metal powder, alloys of Ag metal powder, or mixtures thereof. The particle diameter and shape of the metal powder is not particularly important as long as it is appropriate to the application method. Virtually any shape silver powder, including spherical particles, and flake (rods, cones, plates) may be used in practicing the invention.

The particle size distribution of the metal particles is not itself critical with respect to the effectiveness of the invention. However, as a practical matter, it is preferred that the particles size be in the range of 1 to 100 microns and preferably 2–10 microns.

In addition, it is preferred that the surface area/weight ratio of the silver particles are in the range of 0.1–1.0 $m^2/g$.

Furthermore, it is known that small amounts of other metals may be added to silver conductor compositions to improve the properties of the conductor. Some examples of such metals include: gold, silver, copper, nickel, aluminum, platinum, palladium, molybdenum, tungsten, tantalum, tin, indium, lanthanum, gadolinium, boron, ruthenium, cobalt, titanium, yttrium, europium, gallium, sulfur, zinc, silicon, magnesium, barium, cerium, strontium, lead, antimony, conductive carbon, and combinations thereof and others common in the art of thick film compositions. For example, palladium is frequently added to silver conductor compositions. The additional metal(s) may comprise up to about 1.0 percent by weight of the total composition.

B. Organic Medium

The powders are typically mixed with an organic medium (vehicle) by mechanical mixing to form a pastelike composition, called "pastes", having suitable consistency and rheology for printing. A wide variety of inert liquids can be used as organic medium. The organic medium must be one in which the solids are dispersible with an adequate degree of stability. The rheological properties of the medium must be such that they lend good application properties to the composition. Such properties include: dispersion of solids with an adequate degree of stability, good application of composition, appropriate viscosity, thixotropy, appropriate wettability of the substrate and the solids, a good drying rate, and a dried film strength sufficient to withstand rough handling. The organic medium is not conventional in the art, is typically a solution of polymer in solvent(s), and lends unique properties to the composition.

The polymer resin of the present invention is particularly important. The resin used in the present invention is a member of the fluorocarbon-resin family, polyvinylidene fluoride/hexafluoropropylene (PVDF/HFP) and copolymers thereof, made by polymerizing 1,1-difluoroethylene, $H_2C{=}CF_2$, a colorless gas. The resin is thermally stable to high temperatures, is stronger and more abrasion-resistant than other fluoroplastics, and is easier to process on conventional thermoplastics equipment. Additionally, the polymer resin of the present invention is characterized by the following physical characteristics: (1) melt viscosity of 0.2–0.7 kPoise; (2) DSC melt temperature of 85–98° C.; and (3) mole % of hexafluoropropylene (HFP) in total resin composition of about 12–16 mole %.

The most widely used solvents found in thick film compositions are ethyl acetate and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. In many embodiments of the present invention, solvents such as glycol ethers, ketones, esters and other solvents of like boiling points (in the range of 180° C. to 250° C.), and mixtures thereof may be used. The preferred mediums are based on glycol ethers and β-terpineol. Various combinations of these and other solvents are formulated to obtain the viscosity and volatility requirements desired.

The solids are mixed with the organic medium by mechanical mixing using a planetary mixer, then dispersed on a three roll mill to form a paste-like composition having suitable consistency and rheology for screen printing. The latter is printed as a "thick film" on substrates in the conventional manner as known to those in the art of thick film technology.

The ratio of organic medium in the thick film composition to the inorganic solids in the dispersion is dependent on the method of applying the paste and the kind of organic medium used. Normally to achieve good coverage, the dispersions will contain complementarily 50–91% wt. inorganic solids and 50–9% wt. vehicle, as described above. The compositions of the present invention may, of course, be modified by the addition of other materials, which do not affect its beneficial characteristics. Such formulations are well within the state of the art.

The pastes are conveniently prepared on a three-roll mill. The viscosity of the pastes is typically within the following ranges when measured on a Brookfield HBT viscometer at low, moderate and high shear rates:

| Shear Rate (RPM) | Viscosity (Pa *s) | |
|---|---|---|
| 0.5 | 50–2500 | |
| | 150–1000 | Preferred |
| | 300–750 | Most Preferred |
| 10 | 20–200 | |
| | 50–125 | Preferred |
| | 60–100 | Most Preferred |
| 100 | 5–75 | |
| | 12.5–60 | Preferred |
| | 25–50 | Most Preferred |

Application of Composition

The composition of the present invention may be used in the formation of a membrane touch switch. The membrane touch switch may be formed by a method comprising: (a) preparing the composition of the present invention; (b) applying the composition of a) onto a substrate; (c) drying the composition of b) to form a circuit; and (d) applying a voltage across the circuit of (c).

Additionally, the present invention relates to a membrane touch switch utilizing the composition described herein and above and a membrane touch switch formed by the method described herein.

EXAMPLES

This invention will now be described in further detail with practical and comparative examples (Examples 1–2).

Example 1

Representing Present Invention 25.0 grams (g) of an experimental VDF/HFP co-polymer (provided by Solvay Solexis and described above in the Detailed Description) was dissolved in 75.0 g. of diethylene glycol ethyl ether acetate and stirred at 95C until all resin dissolved, and then cooled to room temp. 25.0 g. of this organic vehicle was then mixed with 75.0 g. of flake silver (average particle size 5 microns) for 30 minutes. After this time, the mixture was subjected to several passes on the three-roll mill at approximately 150 PSI. Following this, approximately 5.0 g. of the above solvent was added to reduce the viscosity of the resulting paste, which will be referred to as silver paste "A". Silver migration test parts were then screen printed using a 280 Stainless Steel mesh screen containing a 0.5 mil emulsion, and were dried at 130° C. for 10 minutes in a box oven. The pattern printed was that of approximately 2 inch long silver traces separated by approximately 40 mils, in an attempt to simulate a typical membrane touch switch (MTS) circuit.

The substrate used was MYLAR, a common one in the MTS industry. The voltage employed was 10 V DC and these parts were exposed to approx. 85 degrees C./85% relative humidity until the point of failure was achieved. Point of failure is defined as a "short circuit" between two adjacent traces caused by silver migration. The longer the number of hours to failure, the better the silver conductor is in terms of silver migration-resistance.

Example 2

Comparative Experiment with Prior Art

Similar procedures were followed as above except that DuPont silver conductor composition 5007 (Available from the E. I. du Pont de Nemours and Company located in Wilmington, Del.) which contains 63.0 wt. % flake silver and a polyester resin dissolved in the same solvent as above] was used in place of the silver paste "A" noted above. This will be referred to as silver paste "B".

| Results of Silver Migration Testing Measured as Hours to Failure at 85° C./85% Relative Humidity 10 V DC | |
|---|---|
| Silver Paste A | 628 hours (mean value) |
| Silver Paste B | 90 hours (mean value) |

As can be seen above, there is a significant difference between the standard MTS conductor (5007) and that of silver paste "A" (Composition of the present invention), the latter being much more resistant to silver migration. Testing at 85° C./85% relative humidity is often referred to as accelerated aging as it simulates years of lifetime in a much shorter period of time. Using established formulas, one can approximate the lifetimes of circuits made with the above compositions. Employing those formulas known to those skilled in the art, one estimates the lifetime of circuits made with silver paste "A" as 30.2 years while that of silver paste "B" as 4.2 years.

What is claimed is:

1. A thick film conductor composition comprising:

a) electrically conductive silver powder;

b) PVDF/HFP polymer resin, copolymers of a PVDF/HFP polymer resin, and mixtures thereof; dissolved in c) organic solvent;

with the provisos that the PVDF/HFP resin has a melt viscosity of 0.2–0.7 kPoise and a DSC melt temperature in the range of 85–98° C.

2. The composition of claim 1 wherein the PVDF/HFP resin contains about 12–16 mole % of hexafluoropropylene (HFP) in the total resin composition.

3. The composition of claim 1 wherein the boiling point of the organic solvent is in the range of 180° C. to 250° C.

4. The composition of claim 1 wherein the organic solvent is selected from the group comprising glycol ethers, ketones, esters, and mixtures thereof.

5. A method of forming a membrane touch switch comprising:

a) preparing the composition of claim 1;

b) applying the composition of a) onto a substrate;

c) drying the composition of b) to form a circuit; and d) applying a voltage across the circuit of c).

6. A membrane touch switch utilizing the composition of claim 1.

7. A membrane touch switch formed by the method of claim 5.

* * * * *